(12) United States Patent
Dawson-Elli et al.

(10) Patent No.: US 9,782,949 B2
(45) Date of Patent: Oct. 10, 2017

(54) GLASS LAMINATED ARTICLES AND LAYERED ARTICLES

(75) Inventors: David Francis Dawson-Elli, Elmira, NY (US); Steven Edward DeMartino, Painted Post, NY (US); Laura L Hluck, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 12 days.

(21) Appl. No.: 12/427,397

(22) Filed: Apr. 21, 2009

(65) Prior Publication Data

US 2009/0297806 A1    Dec. 3, 2009

Related U.S. Application Data

(60) Provisional application No. 61/057,344, filed on May 30, 2008.

(51) Int. Cl.

| | |
|---|---|
| B32B 17/00 | (2006.01) |
| B32B 7/02 | (2006.01) |
| E06B 3/66 | (2006.01) |
| C03C 17/36 | (2006.01) |
| G02F 1/15 | (2006.01) |
| B32B 17/10 | (2006.01) |
| B32B 37/14 | (2006.01) |
| B32B 38/00 | (2006.01) |
| G02F 1/153 | (2006.01) |

(52) U.S. Cl.
CPC .............. *B32B 7/02* (2013.01); *B32B 17/101* (2013.01); *B32B 17/10036* (2013.01); *B32B 17/10091* (2013.01); *B32B 17/10761* (2013.01); *B32B 37/14* (2013.01); *B32B 38/0004* (2013.01); *C03C 17/3668* (2013.01); *C03C 17/3681* (2013.01); *E06B 3/66* (2013.01); *G02F 1/153* (2013.01); *G02F 1/1523* (2013.01); *G02F 1/1533* (2013.01); *C03C 2201/50* (2013.01); *G02F 2001/1536* (2013.01); *G02F 2202/09* (2013.01); *Y10T 428/2495* (2015.01); *Y10T 428/24967* (2015.01); *Y10T 428/26* (2015.01)

(58) Field of Classification Search
CPC ........ G02F 1/15–1/163; B32B 17/00–17/1099
USPC ..... 428/212–220, 411.1, 426–437, 688–702; 501/1–79; 359/275
See application file for complete search history.

(56) References Cited

U.S. PATENT DOCUMENTS

| | | |
|---|---|---|
| 3,521,941 A | 7/1970 | Deb et al. |
| 3,578,843 A | 5/1971 | Castellion |
| 3,589,896 A | 6/1971 | Wilcox et al. |
| 3,649,311 A | 3/1972 | Araujo |

(Continued)

FOREIGN PATENT DOCUMENTS

| | | |
|---|---|---|
| CN | 2590732 Y | 12/2003 |
| DE | 4017888 C1 | 10/1991 |

(Continued)

OTHER PUBLICATIONS

"DuPont Spallshield Composite Product Information". DuPont, (2006); pp. 1-4.*

(Continued)

*Primary Examiner* — Prashant J Khatri

(57) ABSTRACT

Laminated articles and layered articles, for example, low alkali glass laminated articles and layered articles useful for, for example, electrochromic devices are described.

13 Claims, 1 Drawing Sheet

(56) References Cited

U.S. PATENT DOCUMENTS

| | | |
|---|---|---|
| 3,649,440 A | 3/1972 | Megles |
| 3,673,049 A | 6/1972 | Megles |
| 3,682,528 A | 8/1972 | Apfel et al. |
| 3,712,710 A | 1/1973 | Castellion et al. |
| 3,736,047 A | 5/1973 | Gelber et al. |
| 4,046,659 A | 9/1977 | Cormia et al. |
| 4,053,209 A | 10/1977 | Hara et al. |
| 4,086,003 A | 4/1978 | Kouchi et al. |
| 4,102,664 A | 7/1978 | Dumbaugh, Jr. |
| 4,139,275 A | 2/1979 | Yano et al. |
| 4,166,876 A | 9/1979 | Chiba et al. |
| 4,182,551 A | 1/1980 | Washida et al. |
| 4,187,226 A | 2/1980 | Patsch et al. |
| 4,187,336 A | 2/1980 | Gordon |
| 4,226,910 A | 10/1980 | Dahlen et al. |
| 4,239,555 A | 12/1980 | Scharlack et al. |
| 4,256,379 A | 3/1981 | Green |
| 4,293,194 A | 10/1981 | Takahashi |
| 4,308,316 A | 12/1981 | Gordon |
| 4,375,319 A | 3/1983 | Wada et al. |
| 4,377,613 A | 3/1983 | Gordon |
| 4,413,877 A | 11/1983 | Suzuki et al. |
| 4,419,386 A | 12/1983 | Gordon |
| 4,421,985 A | 12/1983 | Billingsley et al. |
| 4,440,822 A | 4/1984 | Gordon |
| 4,462,883 A | 7/1984 | Hart |
| 4,465,339 A | 8/1984 | Baucke et al. |
| 4,524,385 A | 6/1985 | Billingsley et al. |
| 4,554,259 A * | 11/1985 | Franklin et al. ............. 501/67 |
| 4,571,446 A | 2/1986 | Yamazaki |
| 4,625,070 A | 11/1986 | Berman et al. |
| 4,643,629 A | 2/1987 | Takahashi et al. |
| 4,663,009 A | 5/1987 | Bloomquist et al. |
| 4,709,740 A | 12/1987 | Jacoby et al. |
| 4,750,816 A | 6/1988 | Ito et al. |
| 4,756,810 A | 7/1988 | Lamont, Jr. et al. |
| 4,774,757 A | 10/1988 | Sakamoto et al. |
| 4,810,346 A | 3/1989 | Wolf et al. |
| 4,814,297 A | 3/1989 | Beall et al. |
| 4,824,222 A | 4/1989 | Green |
| 4,824,744 A | 4/1989 | Kuo et al. |
| 4,830,471 A | 5/1989 | Demiryont |
| 4,832,755 A | 5/1989 | Barton et al. ............. 136/251 |
| 4,851,095 A | 7/1989 | Scobey et al. |
| 4,858,556 A | 8/1989 | Siebert |
| 4,864,536 A | 9/1989 | Lindmayer |
| 4,870,034 A | 9/1989 | Kiefer ............. 501/66 |
| 4,876,628 A | 10/1989 | Goldner et al. |
| 4,879,644 A | 11/1989 | Gottshall |
| 4,902,110 A | 2/1990 | Green |
| 4,960,324 A | 10/1990 | Brown |
| 4,977,013 A | 12/1990 | Ritchie et al. |
| 5,007,718 A | 4/1991 | Minoura et al. |
| 5,059,254 A | 10/1991 | Yaba et al. ............. 136/251 |
| 5,062,771 A | 11/1991 | Satou et al. |
| 5,066,111 A | 11/1991 | Singleton et al. |
| 5,066,112 A | 11/1991 | Lynam et al. |
| 5,076,673 A | 12/1991 | Lynam et al. |
| 5,080,471 A | 1/1992 | Cogan et al. |
| 5,105,303 A | 4/1992 | Ilhage |
| 5,124,832 A | 6/1992 | Greenberg et al. |
| 5,130,842 A | 7/1992 | Gauthier et al. |
| 5,133,594 A | 7/1992 | Haas et al. |
| 5,138,481 A | 8/1992 | Demiryont |
| 5,155,529 A | 10/1992 | Rushing |
| 5,164,855 A | 11/1992 | Buffat et al. |
| 5,173,733 A | 12/1992 | Green |
| 5,177,628 A | 1/1993 | Moddel |
| 5,202,788 A | 4/1993 | Weppner |
| 5,209,980 A | 5/1993 | Spindler |
| 5,215,821 A | 6/1993 | Ho |
| 5,233,461 A | 8/1993 | Dornan et al. |
| 5,244,557 A | 9/1993 | Defendini et al. |
| 5,260,821 A | 11/1993 | Chu et al. |
| 5,264,286 A | 11/1993 | Ando et al. |
| RE34,469 E | 12/1993 | Cogan et al. |
| 5,286,360 A | 2/1994 | Szczyrbowski et al. |
| 5,288,381 A | 2/1994 | Cogan et al. |
| 5,291,416 A | 3/1994 | Hutchins |
| 5,321,544 A | 6/1994 | Parkhe et al. ............. 359/273 |
| 5,327,281 A | 7/1994 | Cogan et al. |
| 5,336,386 A | 8/1994 | Marx et al. |
| 5,353,148 A | 10/1994 | Eid et al. |
| 5,370,775 A | 12/1994 | Parkhe |
| 5,408,353 A | 4/1995 | Nichols et al. |
| 5,427,669 A | 6/1995 | Drummond |
| 5,449,445 A | 9/1995 | Shinneman et al. |
| 5,471,338 A | 11/1995 | Yu et al. |
| 5,471,554 A | 11/1995 | Rukavina et al. |
| 5,481,395 A | 1/1996 | Byker |
| 5,500,759 A | 3/1996 | Coleman |
| 5,506,180 A * | 4/1996 | Ponthieu ............. 501/66 |
| 5,507,897 A | 4/1996 | Campet et al. |
| 5,514,496 A | 5/1996 | Mishima et al. |
| 5,520,851 A | 5/1996 | Yu et al. |
| 5,532,869 A | 7/1996 | Goldner et al. |
| 5,578,533 A | 11/1996 | Manabe et al. |
| 5,585,959 A | 12/1996 | Brown et al. |
| 5,589,272 A * | 12/1996 | Braun et al. ............. 428/425.6 |
| 5,598,293 A | 1/1997 | Green |
| 5,608,567 A | 3/1997 | Grupp |
| 5,618,390 A | 4/1997 | Yu et al. |
| 5,635,729 A | 6/1997 | Griessen et al. |
| 5,640,274 A | 6/1997 | Iwama et al. |
| 5,657,149 A | 8/1997 | Buffat et al. |
| 5,657,150 A | 8/1997 | Kallman et al. |
| 5,659,417 A | 8/1997 | Van Dine et al. |
| 5,660,114 A | 8/1997 | Gruber |
| 5,663,829 A | 9/1997 | Lefrou et al. |
| 5,666,771 A | 9/1997 | Macquart et al. |
| 5,683,561 A | 11/1997 | Hollars et al. |
| 5,699,192 A | 12/1997 | Van Dine et al. |
| 5,721,633 A | 2/1998 | Nagai et al. |
| 5,724,175 A | 3/1998 | Hichwa et al. |
| 5,724,177 A | 3/1998 | Ellis, Jr. et al. |
| 5,729,379 A | 3/1998 | Allemand et al. |
| 5,737,114 A | 4/1998 | Bailey |
| 5,757,537 A | 5/1998 | Ellis, Jr. et al. |
| 5,763,050 A | 6/1998 | Hirmer |
| 5,777,780 A | 7/1998 | Terada et al. |
| 5,793,518 A | 8/1998 | Lefrou et al. |
| 5,798,860 A | 8/1998 | Yu et al. |
| 5,814,195 A | 9/1998 | Lehan et al. |
| 5,825,526 A | 10/1998 | Bommarito et al. |
| 5,830,336 A | 11/1998 | Schulz |
| 5,831,760 A | 11/1998 | Hashimoto et al. |
| 5,831,851 A | 11/1998 | Eastburn et al. |
| 5,849,415 A | 12/1998 | Shalaby et al. |
| 5,859,723 A | 1/1999 | Jodicke et al. |
| 5,864,419 A | 1/1999 | Lynam |
| 5,905,590 A | 5/1999 | Van Der Sluis et al. |
| 5,916,398 A | 6/1999 | Coleman et al. |
| 5,953,150 A | 9/1999 | Smarto et al. |
| 5,959,762 A | 9/1999 | Bandettini et al. |
| 5,969,847 A | 10/1999 | Coleman et al. |
| 5,970,187 A | 10/1999 | Notten et al. |
| 5,972,184 A | 10/1999 | Hollars et al. |
| 5,973,818 A | 10/1999 | Sjursen et al. |
| 5,973,819 A | 10/1999 | Pletcher et al. |
| 5,978,126 A | 11/1999 | Sjursen |
| 5,985,486 A * | 11/1999 | Giron ............. 429/188 |
| 5,995,273 A | 11/1999 | Chandrasekhar |
| 6,005,705 A | 12/1999 | Schmidt et al. ............. 359/265 |
| 6,006,582 A | 12/1999 | Bhandari et al. |
| 6,010,220 A | 1/2000 | Smarto |
| 6,033,518 A | 3/2000 | Backfisch |
| 6,039,850 A | 3/2000 | Schulz |
| 6,047,107 A | 4/2000 | Roozeboom et al. |
| 6,055,088 A | 4/2000 | Fix et al. |
| 6,060,168 A * | 5/2000 | Kohli ............. 428/428 |
| 6,061,177 A | 5/2000 | Fujimoto |
| 6,066,269 A | 5/2000 | Wei et al. |
| 6,067,184 A | 5/2000 | Bonhote et al. |
| 6,091,184 A | 7/2000 | De Vries |

(56) References Cited

U.S. PATENT DOCUMENTS

| | | |
|---|---|---|
| 6,094,292 A | 7/2000 | Goldner et al. |
| 6,099,117 A | 8/2000 | Gregory |
| 6,101,298 A | 8/2000 | Den Broeder et al. |
| 6,110,016 A | 8/2000 | Coleman et al. |
| 6,118,572 A | 9/2000 | Kostecki et al. |
| 6,120,696 A | 9/2000 | Armand et al. |
| 6,127,516 A | 10/2000 | Bard et al. |
| 6,136,161 A | 10/2000 | Yu et al. |
| 6,143,209 A | 11/2000 | Lynam |
| 6,156,154 A | 12/2000 | McLeod et al. |
| 6,156,171 A | 12/2000 | Hollars et al. |
| 6,160,655 A | 12/2000 | Fix et al. |
| 6,163,926 A | 12/2000 | Watanabe |
| 6,165,547 A | 12/2000 | Leedom |
| 6,165,643 A | 12/2000 | Doyle et al. |
| 6,166,849 A | 12/2000 | Coleman et al. |
| 6,173,116 B1 | 1/2001 | Roozeboom et al. |
| 6,177,130 B1 | 1/2001 | Frey |
| 6,178,034 B1 | 1/2001 | Allemand et al. |
| 6,185,034 B1 | 2/2001 | Nakamura et al. |
| 6,198,225 B1 | 3/2001 | Kano et al. |
| 6,204,953 B1 | 3/2001 | Zieba et al. |
| 6,211,995 B1 | 4/2001 | Azens et al. |
| 6,213,602 B1 | 4/2001 | Smarto |
| 6,214,261 B1 | 4/2001 | Smarto et al. |
| 6,232,782 B1 | 5/2001 | Kacprowicz et al. |
| 6,248,948 B1 | 6/2001 | Nakagawa et al. |
| 6,259,549 B1 | 7/2001 | Leupolz et al. |
| 6,265,222 B1 | 7/2001 | DiMeo, Jr. et al. |
| 6,275,600 B1 | 8/2001 | Banker et al. |
| 6,277,523 B1 | 8/2001 | Giron |
| 6,280,041 B1 | 8/2001 | Unger et al. |
| 6,285,486 B1 | 9/2001 | Kobayashi et al. |
| 6,287,674 B1 | 9/2001 | Verlinden et al. ............ 428/210 |
| 6,290,821 B1 | 9/2001 | McLeod |
| 6,291,096 B1 | 9/2001 | Klein |
| 6,309,516 B1 | 10/2001 | McLeod |
| 6,310,725 B1 | 10/2001 | Duine et al. |
| 6,313,052 B1 | 11/2001 | Nakashima et al. ............ 501/69 |
| 6,317,531 B1 | 11/2001 | Chen et al. |
| 6,328,856 B1 | 12/2001 | Brucker |
| 6,329,061 B2 | 12/2001 | Kondo |
| 6,329,310 B1 | 12/2001 | Peuchert et al. ................ 501/66 |
| 6,337,758 B1 | 1/2002 | Beteille et al. |
| 6,355,125 B1 | 3/2002 | Tahon et al. |
| 6,356,376 B1 | 3/2002 | Tonar et al. |
| 6,358,377 B1 | 3/2002 | Schloremberg et al. |
| 6,377,758 B1 | 4/2002 | OuYang et al. |
| 6,383,956 B2 | 5/2002 | Hawryluk et al. |
| 6,395,350 B1 | 5/2002 | Balkus, Jr. et al. |
| 6,420,071 B1 | 7/2002 | Lee et al. |
| 6,429,961 B1 | 8/2002 | Harary et al. |
| 6,437,900 B1 | 8/2002 | Cornelissen et al. |
| 6,444,100 B1 | 9/2002 | McLeod |
| 6,468,405 B1 | 10/2002 | Rou et al. |
| 6,495,390 B2 | 12/2002 | Hawryluk et al. |
| 6,497,799 B1 | 12/2002 | McLeod |
| 6,515,787 B1 | 2/2003 | Westfall et al. |
| 6,529,308 B2 | 3/2003 | Beteille et al. |
| 6,535,126 B2 | 3/2003 | Lin et al. |
| 6,559,411 B2 | 5/2003 | Borgeson et al. |
| 6,572,990 B1 | 6/2003 | Oyama et al. ................ 428/698 |
| 6,582,572 B2 | 6/2003 | McLeod |
| 6,583,919 B2 | 6/2003 | Mizutani et al. |
| 6,608,713 B2 | 8/2003 | Ouwerkerk et al. |
| 6,618,180 B2 | 9/2003 | Mochizuka |
| 6,620,342 B1 | 9/2003 | Burchill et al. |
| 6,631,022 B1 | 10/2003 | Kihira et al. |
| 6,635,194 B2 | 10/2003 | Kloeppner et al. |
| 6,643,050 B2 | 11/2003 | Rukavina et al. |
| 6,652,974 B1 | 11/2003 | Krisko |
| 6,678,083 B1 | 1/2004 | Anstee |
| 6,689,253 B1 | 2/2004 | Koh et al. |
| 6,710,907 B2 | 3/2004 | Mochizuka et al. |
| 6,746,775 B1 | 6/2004 | Boire et al. |
| 6,747,779 B1 | 6/2004 | Morin et al. |
| 6,749,729 B1 | 6/2004 | Xu et al. |
| 6,791,737 B2 | 9/2004 | Giron |
| 6,795,226 B2 * | 9/2004 | Agrawal et al. ............... 359/265 |
| 6,800,355 B2 | 10/2004 | Wong ............................ 428/141 |
| 6,815,122 B2 | 11/2004 | Barker et al. |
| 6,819,467 B2 | 11/2004 | Lynam |
| 6,822,778 B2 | 11/2004 | Westfall et al. |
| 6,825,965 B2 | 11/2004 | Minami et al. |
| 6,843,892 B1 | 1/2005 | McLeod |
| 6,844,115 B2 | 1/2005 | Gan et al. |
| 6,856,444 B2 | 2/2005 | Ingalls et al. |
| 6,859,297 B2 | 2/2005 | Lee et al. |
| 6,867,893 B2 | 3/2005 | Patz et al. |
| 6,871,967 B2 | 3/2005 | Fukazawa |
| 6,893,544 B2 | 5/2005 | Song et al. |
| 6,919,530 B2 | 7/2005 | Borgeson et al. |
| 6,926,786 B2 | 8/2005 | Frost et al. ................... 156/101 |
| 6,940,628 B2 | 9/2005 | Giron |
| RE38,959 E | 1/2006 | Kohli |
| 6,995,891 B2 | 2/2006 | Agrawal et al. |
| 7,001,868 B2 | 2/2006 | Sawano |
| 7,002,720 B2 | 2/2006 | Beteille et al. |
| 7,012,735 B2 | 3/2006 | Honeyman et al. |
| 7,033,655 B2 | 4/2006 | Beteille et al. |
| 7,038,828 B2 | 5/2006 | Xu et al. |
| 7,042,615 B2 | 5/2006 | Richardson |
| 7,061,010 B2 | 6/2006 | Minakata |
| 7,110,157 B2 * | 9/2006 | Beteille et al. ................ 359/265 |
| 7,124,006 B2 | 10/2006 | Davidson et al. |
| 7,157,133 B2 | 1/2007 | Moran |
| 7,158,277 B2 | 1/2007 | Berggren et al. |
| 7,160,624 B2 | 1/2007 | Fukatani et al. ............... 428/437 |
| 7,179,535 B2 | 2/2007 | Fisher .......................... 428/437 |
| 7,193,763 B2 | 3/2007 | Beteille et al. |
| 7,214,455 B2 | 5/2007 | Miyoshi et al. |
| 7,230,748 B2 | 6/2007 | Giron et al. |
| 7,236,292 B2 | 6/2007 | LeCain et al. |
| 7,245,414 B2 | 7/2007 | Liang et al. |
| 7,256,923 B2 | 8/2007 | Liu et al. |
| 7,265,891 B1 | 9/2007 | Demiryont |
| 7,277,215 B2 | 10/2007 | Greer |
| 7,286,061 B2 | 10/2007 | Atkinson |
| 7,297,407 B2 | 11/2007 | Anderson ..................... 428/441 |
| 7,312,275 B2 | 12/2007 | Papenfuhs et al. |
| 7,312,914 B2 | 12/2007 | Shinozaki et al. |
| 7,323,426 B2 | 1/2008 | Aitken |
| 7,372,610 B2 | 5/2008 | Burdis et al. |
| 7,379,225 B2 | 5/2008 | Tonar et al. |
| 7,414,771 B2 | 8/2008 | Martin |
| 7,428,090 B2 | 9/2008 | Fukazawa et al. |
| 7,531,101 B2 | 5/2009 | Beteille |
| 7,564,611 B2 | 7/2009 | Jang et al. |
| 7,585,567 B2 | 9/2009 | Seto et al. |
| 7,593,154 B2 | 9/2009 | Burdis et al. |
| 7,602,542 B2 | 10/2009 | Tonar et al. |
| 7,604,717 B2 | 10/2009 | Beteille et al. |
| 7,675,667 B2 | 3/2010 | Xu et al. |
| 7,679,809 B2 | 3/2010 | Tonar et al. |
| 7,704,555 B2 | 4/2010 | Demiryont |
| 7,710,671 B1 | 5/2010 | Kwak et al. |
| 7,715,082 B2 | 5/2010 | Wang et al. |
| 7,733,554 B2 | 6/2010 | Danner et al. |
| 7,771,061 B2 | 8/2010 | Varaprasad et al. |
| 7,777,933 B2 | 8/2010 | Piroux et al. |
| 7,785,663 B2 | 8/2010 | Kido et al. |
| 7,791,782 B2 | 9/2010 | Paolini, Jr. et al. |
| 7,791,784 B2 | 9/2010 | Giron et al. |
| 7,808,692 B2 | 10/2010 | Karmhag et al. |
| 7,817,327 B2 | 10/2010 | Derda |
| 7,830,583 B2 | 11/2010 | Neuman et al. |
| 7,830,585 B2 | 11/2010 | Widjaja et al. |
| 7,839,564 B2 | 11/2010 | Whitesides et al. |
| 7,869,114 B2 | 1/2011 | Valentin et al. |
| 7,871,169 B2 | 1/2011 | Varaprasad et al. |
| 7,874,666 B2 | 1/2011 | Xu et al. |
| 7,894,119 B2 | 2/2011 | Valentin et al. |
| 7,894,120 B2 | 2/2011 | Valentin et al. |
| 7,911,674 B2 | 3/2011 | Gaskell et al. |

(56) References Cited

U.S. PATENT DOCUMENTS

| | | |
|---|---|---|
| 7,916,380 B2 | 3/2011 | Tonar et al. |
| 7,929,194 B2 | 4/2011 | Legois et al. |
| 7,952,785 B2 | 5/2011 | Karmhag et al. |
| 7,957,053 B2 | 6/2011 | Honeyman et al. |
| 7,961,375 B2 | 6/2011 | Phillips |
| 7,988,885 B2 | 8/2011 | Percec et al. |
| 8,004,744 B2 | 8/2011 | Burdis et al. |
| 8,071,420 B2 | 12/2011 | Su et al. |
| 8,102,587 B2 | 1/2012 | Bressand et al. |
| 8,115,984 B2 | 2/2012 | Agrawal et al. |
| 8,154,788 B2 | 4/2012 | Millett et al. |
| 8,164,817 B2 | 4/2012 | Varaprasad et al. |
| 8,164,818 B2 | 4/2012 | Collins et al. |
| 8,168,265 B2 | 5/2012 | Kwak et al. |
| 8,200,390 B2 | 6/2012 | Brown et al. |
| 8,218,224 B2 | 7/2012 | Kwak et al. |
| 8,243,357 B2 | 8/2012 | Kozlowski et al. |
| 8,248,680 B2 | 8/2012 | Brown et al. |
| 8,256,940 B2 | 9/2012 | Brown et al. |
| 8,274,730 B2 | 9/2012 | Valentin et al. |
| 8,284,472 B2 | 10/2012 | Yoshimura et al. |
| 8,287,767 B2 | 10/2012 | Percec et al. |
| 8,289,607 B2 | 10/2012 | Valentin et al. |
| 8,289,609 B2 | 10/2012 | Lamine et al. |
| 8,289,610 B2 | 10/2012 | Veerasamy |
| 8,405,896 B2 | 3/2013 | Lamine et al. |
| 8,405,901 B2 | 3/2013 | Boote |
| 8,432,600 B2 | 4/2013 | Brown et al. |
| 8,432,603 B2 | 4/2013 | Wang et al. |
| 8,446,664 B2 | 5/2013 | Chen et al. |
| 8,482,835 B2 | 7/2013 | LeCain et al. |
| 8,482,836 B2 | 7/2013 | Luan et al. |
| 8,482,837 B2 | 7/2013 | Sbar et al. |
| 8,482,838 B2 | 7/2013 | Sbar et al. |
| 8,506,096 B2 | 8/2013 | McCabe et al. |
| 8,513,813 B2 | 8/2013 | Crisp et al. |
| 8,562,157 B2 | 10/2013 | Lynam |
| 8,571,754 B2 | 10/2013 | Brown et al. |
| 8,643,930 B2 | 2/2014 | Gillaspie et al. |
| 8,736,947 B2 | 5/2014 | Kwak et al. |
| 8,901,812 B2 | 12/2014 | Seo et al. |
| 8,970,938 B2 | 3/2015 | Granqvist |
| 2001/0033912 A1 | 10/2001 | Sommer et al. |
| 2002/0075552 A1 | 6/2002 | Poll et al. |
| 2002/0118437 A1 | 8/2002 | Rukavina et al. |
| 2002/0154535 A1 | 10/2002 | Bocian et al. |
| 2002/0160270 A1 | 10/2002 | Bronstert et al. |
| 2003/0227663 A1 | 12/2003 | Agrawal et al. |
| 2004/0021921 A1 | 2/2004 | Richardson |
| 2004/0028883 A1 | 2/2004 | Straub et al. |
| 2004/0124665 A1 | 7/2004 | Kraenzler et al. |
| 2004/0141141 A1* | 7/2004 | Ota et al. ............. 349/153 |
| 2004/0150867 A1 | 8/2004 | Lee et al. |
| 2004/0155263 A1 | 8/2004 | Giron |
| 2004/0229444 A1 | 11/2004 | Couillard et al. ............. 438/455 |
| 2005/0002081 A1* | 1/2005 | Beteille et al. ............. 359/275 |
| 2005/0041276 A1 | 2/2005 | Beteille et al. |
| 2005/0054419 A1 | 3/2005 | Souza et al. |
| 2005/0250639 A1* | 11/2005 | Siebers et al. ............. 501/68 |
| 2006/0028730 A1 | 2/2006 | Varaprasad et al. |
| 2006/0035021 A1 | 2/2006 | Hartig |
| 2006/0139726 A1* | 6/2006 | Kloeppner et al. ............. 359/265 |
| 2006/0261447 A1 | 11/2006 | Seto et al. |
| 2006/0276322 A1 | 12/2006 | Hasegawa et al. |
| 2007/0020442 A1* | 1/2007 | Giron ............. B32B 17/10 428/192 |
| 2007/0097481 A1 | 5/2007 | Burdis et al. |
| 2007/0125684 A1 | 6/2007 | Biesmans et al. |
| 2007/0190340 A1 | 8/2007 | Coppola et al. ............. 428/432 |
| 2007/0223096 A1 | 9/2007 | O'Connor et al. |
| 2008/0006525 A1 | 1/2008 | Fanton |
| 2008/0169185 A1 | 7/2008 | Burdis et al. |
| 2008/0212160 A1 | 9/2008 | Fanton et al. |
| 2009/0057137 A1 | 3/2009 | Pitts et al. |
| 2009/0097096 A1 | 4/2009 | Noh et al. |
| 2009/0181203 A1 | 7/2009 | Valentin et al. |
| 2010/0007937 A1 | 1/2010 | Widjaja et al. |
| 2010/0163107 A1 | 7/2010 | Sakamoto et al. |
| 2010/0172011 A1 | 7/2010 | Piroux et al. |
| 2010/0208325 A1 | 8/2010 | Piroux |
| 2010/0243427 A1 | 9/2010 | Kozlowski et al. |
| 2010/0245973 A1 | 9/2010 | Wang et al. |
| 2011/0019260 A1 | 1/2011 | McCabe et al. |
| 2011/0043885 A1 | 2/2011 | Lamine et al. |
| 2011/0043886 A1 | 2/2011 | Jeon et al. |
| 2011/0094584 A1 | 4/2011 | Sawada et al. |
| 2011/0151283 A1 | 6/2011 | Gillaspie et al. |
| 2011/0211247 A1 | 9/2011 | Kozlowski et al. |
| 2011/0216389 A1 | 9/2011 | Piroux et al. |
| 2011/0266138 A1 | 11/2011 | Wang et al. |
| 2011/0267674 A1 | 11/2011 | Wang et al. |
| 2011/0267675 A1 | 11/2011 | Wang et al. |
| 2011/0304899 A1 | 12/2011 | Kwak et al. |
| 2012/0134004 A1 | 5/2012 | Melcher et al. |
| 2012/0182593 A1 | 7/2012 | Collins et al. |
| 2012/0194895 A1 | 8/2012 | Podbelski et al. |
| 2012/0212794 A1 | 8/2012 | Giron et al. |
| 2012/0320330 A1 | 12/2012 | Brown et al. |
| 2012/0327499 A1 | 12/2012 | Parker et al. |
| 2013/0094073 A1 | 4/2013 | Ushigome |
| 2013/0222877 A1 | 8/2013 | Greer et al. |
| 2013/0258437 A1 | 10/2013 | Sbar et al. |
| 2013/0258438 A1 | 10/2013 | Sbar et al. |
| 2013/0278989 A1 | 10/2013 | Lam et al. |
| 2013/0286458 A1 | 10/2013 | Lamine et al. |

FOREIGN PATENT DOCUMENTS

| | | | |
|---|---|---|---|
| DE | 10164273 | 7/2003 | ........... H01L 31/048 |
| DE | 102006042538 | 3/2008 | |
| EP | 0869105 | 10/1998 | |
| EP | 1227362 | 10/2005 | |
| EP | 2023435 | 2/2009 | |
| GB | 2002344 | 2/1979 | |
| GB | 2146795 | 4/1985 | |
| JP | 54101345 | 8/1979 | |
| JP | 54120688 | 9/1979 | |
| JP | 58037622 | 3/1983 | |
| JP | 60021030 | 2/1985 | |
| JP | 62220357 | 9/1987 | |
| JP | 7-287218 | 10/1995 | |
| JP | 1995287218 | 10/1995 | |
| JP | 1996152415 | 6/1996 | |
| JP | 1998-1335 A | 1/1998 | |
| JP | 1998001335 | 1/1998 | |
| JP | 2000017956 | 1/2000 | |
| JP | 2004112057 A | 4/2004 | |
| JP | 2006521228 | 9/2006 | |
| JP | WO2008/149793 | 12/2008 | |
| KR | 2004057144 | 7/2004 | |
| KR | 2006092362 | 8/2006 | |
| WO | 8909424 | 10/1989 | |
| WO | 9606203 | 2/1996 | |
| WO | 2004016897 | 2/2004 | |
| WO | 2009145876 | 12/2009 | |
| WO | 2009145909 | 12/2009 | |

OTHER PUBLICATIONS

Dietz et al. "Glass". Van Nostrand's Encyclopedia of Chemistry, John Wiley & Sons, Inc., (2005); pp. 1-30.*
Taiwan Patent Application No. 098117929 Search Report.
DuPont; DuPont™ Spallshied® Composite Product Information; DuPont™, The Miracle of Science™, Butacite® and Spallshied®; © 2006; pp. 1-4.
DuPont; Hurricane-Resistant Glazing Laminated Glass with DuPont™ SentryGlas® Interlayer; Oct. 28, 2014; pp. 1-7.
Carmichael, D. C. et al; NASA Review; "Final Report: Review of World Experience and Properties of Materials for Encapsulation of Terrestial Photovoltaic Arrays;" Jul. 21, 1976; 196 pages.
Japanese Office Action, dated Mar. 22, 2016, pp. 1-3, Japanese Application No. 2015-004827, Japan.

(56) References Cited

OTHER PUBLICATIONS

Ashrit et al; "Electrochromic Properties of Nanocrystalline Tungsten Oxide Thin Films"; Thin Solid Films 320 (1998) 324-328.
Burdis et al; "Electrochromic Windows: Process and Fabrication Improvements for Lower Total Costs"; Sage Electrochromics, Inc; Issued Date Mar. 31, 2009; 47 Pages.
Burdis et al; "Focused R&D for Electrochromic Smart Windows: Significant Performance and Yeild Enhancements"; Sage Electrochromics, Inc.; Issued Date Nov. 30, 2002; 46 Pages.
Burdis et al; "Focused R&D for Electrochromic Smart Windows: Significant Performance and Yeild Enhancements"; Sage Electrochromics, Inc.; Issued Date Sep. 23, 2004; 76 Pages.
Burdis et al; "Increasing Yields and Broadening Markets: Process Innovations in the Manufacturing of Energy-Saving Window Glazings"; Sage Electrochromics, Inc.; Issued Date Nov. 2003; 78 Pages.
Burdis et al; "Technology Advancements to Lower Costs of Electrochromic Window Glazing"; Sage Electrochromics, Inc.; Issued Apr. 2, 2010; 40 Pages.
Hersh et al; "Mechanism of Electrochromism in WO3"; Applied Physics Letters, vol. 27, No. 12, Dec. 15, 1975; pp. 646-648.
Kamal et al; "The Electrochromic Behavior of Nickel Oxide Films Sprayed at Different Preparative Conditions"; Thin Solid Films 483 (2005) 330-339.
Lee et al; "Characterization of Ni—W Oxide Thin Film Electrodes"; Solid State Ionics 109 (1998) 303-310.
Lee et al; "Electrochromic Behavior of Ni—W Oxide Electrodes"; Solar Energy Materials and Solar Cells; 39 (1995) 155-166.
Lee et al; "Electrochromic Mechanism in A—WO3—Y Thin Films"; Applied Physics Letters, vol. 74, No. 2; Jan. 1999; 3 Pages.
Lee et al; "Raman Spectroscopic Studies of Ni—W Oxide Thin Films"; Solid State Ionics; 140 (2001) 135-139.
Passerini et al; "The Intercalation of Lithium in Nickel Oxide and Its Electrochromic Properties"; J. Electrochem. Soc. vol. 137, No. 10, Oct. 1990; pp. 3297-3300.
Author Unknown; Electrochromic Windows: Advanced Processing Technology; Sage Electrochromics, Inc.; Dec. 13, 2006; 44 Pages.
US Department of Energy; "Final Environmental Assessment for Depart. of Energy Loan; Sage Electrochromics Sageglass® High Volume Manufacturing (HVM)"; Jul. 2009; 64 Pages.
US Department of Energy; "Small Business Innovation Research Program Final Report"; DOP Patent Clearance Granted Jan. 30, 2002; Sage Electrochromics, Inc.; 25 Pages.
Yoshimura et al; "Electrochromism in a Thin-Film Device Using Li2WO4 as an Li-Electrolyte"; Japanese Journal of Applied Physics; vol. 22, No. 1, Jan. 1983; pp. 152-156.
English Translation of CN200980119937.8 Notice of First Office Action dated Jan. 30, 2013; 9 Pages; Chinese Patent Office.
English Translation of CN200980126048.4 Notice of First Office Action dated Oct. 22, 2012; 8 Pages; Chinese Patent Office.
English Translation of JP2011511610 First Office Action dated Apr. 1, 2014; 2 Pages; Japanese Patent Office.
English Translation of JP201151610 First Office Action dated Apr. 9, 2013; 3 Pages; Japanese Patent Office.
International Search Report of the International Searching Authority; PCT/US2009/003106; dated Aug. 5, 2009; 6 Pages; European Patent Office.
International Search Report of the International Searching Authority; PCT/US2009/003295; dated Aug. 5, 2009; 4 Pages; European Patent Office.
Patent Examination Report No. 1 for AU2009251792 dated Jun. 25, 2013; 5 Pages; Australian Government.
KR20107029021 Office Action dated Sep. 30, 2015.

* cited by examiner

GLASS LAMINATED ARTICLES AND LAYERED ARTICLES

This patent application claims the benefit of priority to U.S. Provisional Patent Application 61/057,344 filed on May 30, 2008.

BACKGROUND

Field

Embodiments of the invention relate to laminated articles and layered articles and more particularly to low alkali glass laminated articles and layered articles useful for, for example, electrochromic devices.

Technical Background

The management of natural light is a consideration in architectural design, for example, how to maximize the view of the outside while ensuring that the interior of the building is comfortable for the occupants. For example, too much light can increase the heat and/or brightness inside the building. Windows which can be switched from transparent to varying degrees of tinted and back to transparent, for example, electrochromic windows, are being developed to minimize one or more disadvantages associated with increased glass usage, for example, heat gain and glare.

Windows for use, for example, in automobiles and in architecture must meet several safety codes and are subject to mechanical strength tests, for example, debris impact tests and post-breakage wind cycling. Windows can benefit from increased mechanical strength, for example, in order to withstand environmental conditions.

Functional materials for electrochromic, photochromic, thermochromic, and low-e type applications are typically applied to a thick soda lime glass substrate, which is laminated to a second thick soda lime glass substrate in order to meet the above mentioned safety codes. The substrates are often coated with a barrier layer in order to minimize alkali, for example, sodium diffusion from the substrate into the functional materials. However, any breaks in the barrier layer, for example, scratches can allow sodium or alkalis to enter the functional material, compromising the utility of the functional material. Defects in the soda lime glass, for example, bubbles, scratches, inclusions can also compromise the utility of the functional material.

Glass strength can depend on exposure temperatures, aspect ratio, plate size, stiffness and load duration. Laminated glass can be made with annealed, heat strengthened, and/or fully tempered for additional benefits, such as resistance to increased wind loading, increased impact resistance or resistance to thermal stress.

It would be advantageous to have laminated articles and layered articles in which alkali diffusion such as sodium diffusion can be minimized and where mechanical strength and/or clarity can be maximized.

SUMMARY

Laminated articles and layered articles of the invention address one or more of the above-mentioned disadvantages of conventional laminated articles and layered articles and provide one or more of the following advantages: minimizing alkali diffusion, for example, sodium diffusion into the functional material from the glass, reduction of defects in the glass, increased clarity, and minimized weight.

One embodiment is an article comprising:
a glass layer having a coefficient of thermal expansion $50 \times 10^{-7}/°$ C. or less;
a functional material disposed on the glass layer;
a substrate comprising a glass, a polymer, or a combination thereof, and having a thickness greater than that of the glass layer; and
a laminate layer disposed between the substrate and either the glass layer or functional material.

Another embodiment is an article comprising:
a glass layer having a sodium oxide content of 10 percent by weight or less;
an electrochromic, a thermochromic, a photochromic, a low-e type, an actively defrosting, a transparent conductive oxide material, or a combinations thereof disposed on the glass layer;
a substrate comprising a glass, a polymer, or a combination thereof, and having a thickness greater than that of the glass layer; and
a laminate layer disposed between the substrate and either the glass layer or functional material.

Another embodiment is an article comprising:
a glass layer having a coefficient of thermal expansion $50 \times 10^{-7}/°$ C. or less;
an electrochromic material disposed on the glass layer; and
a protective layer disposed on a surface of the electrochromic material not in contact with the glass layer.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that both the foregoing general description and the following detailed description are merely exemplary of the invention, and are intended to provide an overview or framework for understanding the nature and character of the invention as it is claimed.

The accompanying drawings are included to provide a further understanding of the invention, and are incorporated in and constitute a part of this specification. The drawings illustrate one or more embodiment(s) of the invention and together with the description serve to explain the principles and operation of the invention.

BRIEF DESCRIPTION OF THE DRAWINGS

The invention can be understood from the following detailed description either alone or together with the accompanying drawing figures.

DETAILED DESCRIPTION

Reference will now be made in detail to various embodiments of the invention, examples of which are illustrated in the accompanying drawings. Wherever possible, the same reference numbers will be used throughout the drawings to refer to the same or like parts.

Figure 1:
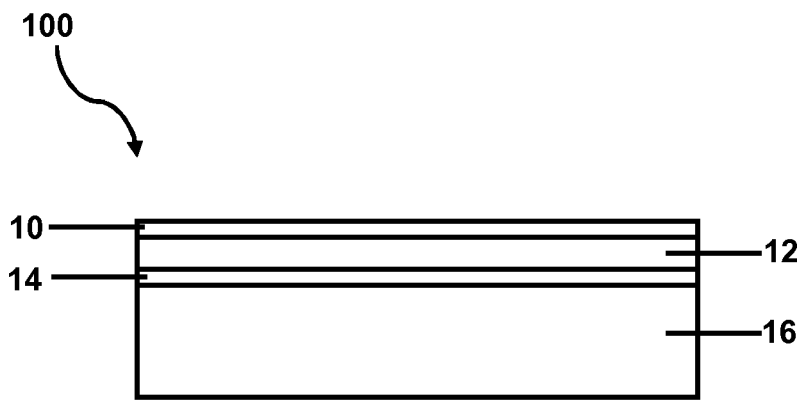
FIG. 1 is a schematic of an article according to one embodiment.
Figure 2:
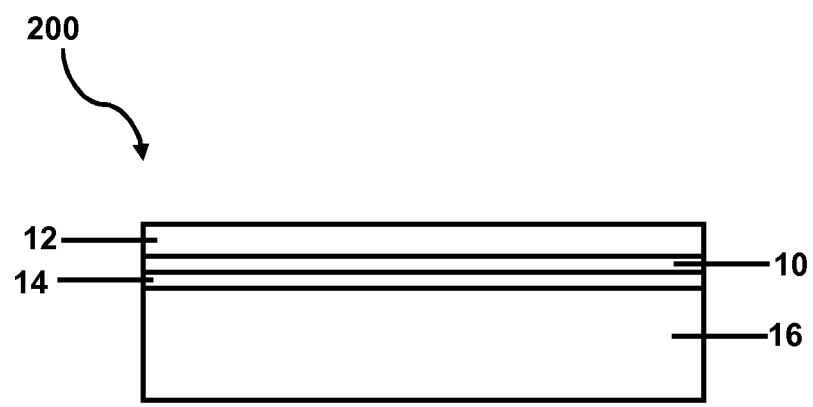
FIG. 2 is a schematic of an article according to one embodiment.

One embodiment, as shown in FIG. 1 and FIG. 2 is an article 100 and 200, respectively, comprising:

a glass layer 12 having a coefficient of thermal expansion $50\times10^{-7}/°$ C. or less;
a functional material 10 disposed on the glass layer;
a substrate 16 comprising a glass, a polymer, or a combination thereof, and having a thickness greater than that of the glass layer; and
a laminate layer 14 disposed between the substrate and either the glass layer or functional material.

Another embodiment, is an article comprising:
a glass layer having an alkali oxide content of 10 percent by weight or less;
an electrochromic, a thermochromic, a photochromic, a low-e type, an actively defrosting, a transparent conductive oxide material, or a combination thereof disposed on the glass layer;
a substrate comprising a glass, a polymer, or a combination thereof, and having a thickness greater than that of the glass layer; and
a laminate layer disposed between the substrate and either the glass layer or functional material.

Another embodiment is an article comprising:
a glass layer having a sodium oxide content of 10 percent by weight or less;
an electrochromic, a thermochromic, a photochromic, a low-e type, an actively defrosting, a transparent conductive oxide material, or a combination thereof disposed on the glass layer;
a substrate comprising a glass, a polymer, or a combination thereof, and having a thickness greater than that of the glass layer; and
a laminate layer disposed between the substrate and either the glass layer or functional material.

Another embodiment is an article comprising:
a glass layer having a coefficient of thermal expansion $50\times10^{-7}/°$ C. or less;
an electrochromic material disposed on the glass layer;
a substrate comprising a glass, a polymer, or a combination thereof, and having a thickness greater than that of the glass layer; and
a laminate layer disposed between the substrate and either the glass layer or functional material.

Another embodiment is an article comprising:
a transparent glass layer having an alkali oxide content of 10 percent by weight or less, wherein the transparent glass layer has thickness of from 0.5 mm to 4 mm;
an electrochromic material disposed on the transparent glass layer;
a substrate comprising a glass, a polymer, or a combination thereof, and having a thickness greater than that of the transparent glass layer; and
a laminate layer comprising a material selected from polyvinyl butyral, a UV curable resin, a thermoplastic, a thermoplastic ionoplast, polycarbonate, polyurethane, a UV curable polymer, silicone, and combinations thereof disposed between the substrate and either the transparent glass layer or functional material.

According to some embodiments, the glass layer has a thickness of 4.0 mm or less, for example, 3.5 mm or less, for example, 3.2 mm or less, for example, 3.0 mm or less, for example, 2.5 mm or less, for example, 2.0 mm or less, for example, 1.9 mm or less, for example, 1.8 mm or less, for example, 1.5 mm or less, for example, 1.1 mm or less, for example, 0.5 mm to 2.0 mm, for example, 0.5 mm to 1.1 mm, for example, 0.7 mm to 1.1 mm. Although these are exemplary thicknesses, the glass layer can have a thickness of any numerical value including decimal places in the range of from 0.1 mm up to and including 4.0 mm.

The glass layer can have a relatively low coefficient of thermal expansion (CTE), for example, $50\times10^{-7}/°$ C. or less, for example, $35\times10^{-7}/°$ C. or less. According to one embodiment, the glass layer has a CTE of $20\times10^{-7}/°$ C. to $50\times10^{-7}/°$ C., for example, $20\times10^{-7}/°$ C. to $35\times10^{-7}/°$ C.

The glass layer, in some embodiments, is transparent.

In one embodiment, the laminate layer comprises a material selected from polyvinyl butyral, a UV curable resin, a thermoplastic, a thermoplastic ionoplast, polycarbonate, polyurethane, a UV curable polymer, silicone, and combinations thereof.

The substrate, according to one embodiment comprises a glass, a polymer, or a combination thereof. For instance, the substrate can comprise a material selected from float glass, fusion formable glass, soda lime glass, plastic, polycarbonate, and combinations thereof.

The electrochromic, thermochromic, photochromic, low-e type, actively defrosting, or transparent conductive oxide material can comprise a single layer or multiple layers. The electrochromic functional material can comprise multiple layers such as an electrode layer or layers, a counter electrode layer or layers, an ion conducting layer or layers. The layers, in some embodiments, can comprise solid inorganic materials.

The glass layer, according to one embodiment, comprises an alkali oxide content of 10 percent by weight or less, for example, 9 percent or less, for example, 8 percent or less, for example, 5 percent or less, for example, 0.5 percent or less. In one embodiment, the alkali oxide content is in the range of from 0.1 percent to 10 percent. Although these are exemplary alkali oxide contents, the glass layer can have alkali oxide contents of any numerical value including decimal places in the range of from 0 up to and including 10 percent by weight.

The glass layer, according to one embodiment, comprises a sodium oxide content of 10 percent by weight or less, for example, 9 percent or less, for example, 8 percent or less, for example, 5 percent or less, for example, 0.5 percent or less. In one embodiment, the sodium oxide content is in the range of from 0.1 percent to 10 percent by weight. Although these are exemplary sodium oxide contents, the glass layer can have sodium oxide contents of any numerical value including decimal places in the range of from 0 up to and including 10 percent by weight.

According to some embodiments, the configuration of the article can be, for example, those described by FIG. 1 and FIG. 2, however, other configurations can be used in accordance with the invention. For example, the laminate layer, can be disposed between the substrate and either the glass layer or functional material.

Figure 3:
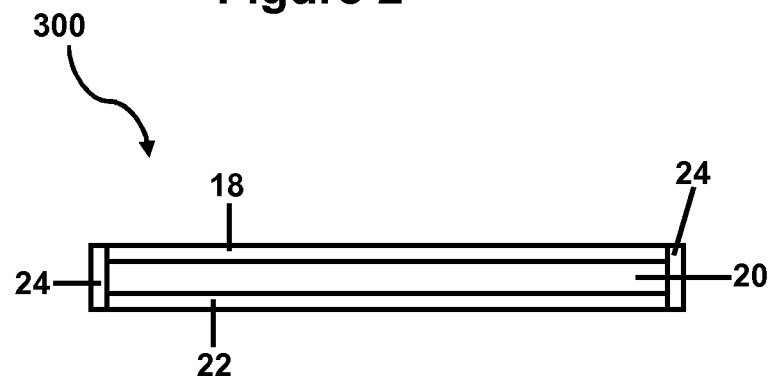
FIG. 3 is a schematic of an article according to one embodiment.

Another embodiment as shown in FIG. 3 is an article 300 comprising a glass layer 18 having a glass layer having a coefficient of thermal expansion $50\times10^{-7}/°$ C. or less; an electrochromic material 20 disposed on the glass layer; and a protective layer 22 disposed on a surface of the electrochromic material not in contact with the glass layer. The article, according to one embodiment, further comprises a seal material 24 joining the protective layer and the glass layer such that the combination of the protective layer, the glass layer, and the seal material together enclose the electrochromic material. The seal material can be selected from a frit, a glass sheet, and a sputtered glass. The seal material in combination with the protective layer and the glass layer can minimize deleterious effects of exposing the electrochromic material to the environment, for example, during shipping, manufacturing of a window, and/or in the final product such as a window in a building or in an automobile.

In this embodiment, the electrochromic material can comprise multiple layers such as an electrode layer or layers, a counter electrode layer or layers, an ion conducting layer or layers. The layers, in some embodiments, can comprise solid inorganic materials.

In this embodiment, the glass layer can have a thickness of 4.0 mm or less, for example, 3.5 mm or less, for example, 3.2 mm or less, for example, 3.0 mm or less, for example, 2.5 mm or less, for example, 2.0 mm or less, for example, 1.9 mm or less, for example, 1.8 mm or less, for example, 1.5 mm or less, for example, 1.1 mm or less, for example, 0.5 mm to 2.0 mm, for example, 0.5 mm to 1.1 mm, for example, 0.7 mm to 1.1 mm. Although these are exemplary thicknesses, the glass layer can have a thickness of any numerical value including decimal places in the range of from 0.1 mm up to and including 4.0 mm.

The glass layer can have a relatively low coefficient of thermal expansion (CTE), for example, $50 \times 10^{-7}/°$ C. or less, for example, $35 \times 10^{-7}/°$ C. or less. According to one embodiment, the glass layer has a CTE of $20 \times 10^{-7}/°$ C. to $50 \times 10^{-7}/°$ C., for example, $20 \times 10^{-7}/°$ C. to $35 \times 10^{-7}/°$ C.

The glass layer, in some embodiments, is transparent.

The protective layer can provide chemical or mechanical durability. The protective layer can be a sputtered glass layer or a sheet of glass, for example, a transparent glass layer or sheet. The protective layer, according to some embodiments, has a thickness of 4.0 mm or less, for example, 3.5 mm or less, for example, 3.2 mm or less, for example, 3.0 mm or less, for example, 2.5 mm or less, for example, 2.0 mm or less, for example, 1.9 mm or less, for example, 1.8 mm or less, for example, 1.5 mm or less, for example, 1.1 mm or less, for example, 0.5 mm to 2.0 mm, for example, 0.5 mm to 1.1 mm, for example, 0.7 mm to 1.1 mm. Although these are exemplary thicknesses, the protective layer can have a thickness of any numerical value including decimal places in the range of from 0.1 mm up to and including 4.0 mm.

The protective layer can have a relatively low coefficient of thermal expansion (CTE), for example, $50 \times 10^{-7}/°$ C. or less, for example, $35 \times 10^{-7}/°$ C. or less. According to one embodiment, the protective layer has a CTE of $20 \times 10^{-7}/°$ C. to $50 \times 10^{-7}/°$ C., for example, $20 \times 10^{-7}/°$ C. to $35 \times 10^{-7}/°$ C.

The protective layer, in some embodiments, is transparent.

In some embodiments, the electrochromic material can comprise multiple layers such as an electrode layer or layers, a counter electrode layer or layers, an ion conducting layer or layers. The layers, in some embodiments, can comprise solid inorganic materials.

Laminating thin, low CTE, low alkali glass coated with a functional material to thick soda lime glass enables process improvements and can minimize costs. Low CTE, low alkali glass is durable, has increased clarity as compared to soda lime glass, and can be made with minimal defects, for example, in display glass applications for televisions.

In architectural windows, commercially available windows are typically 6 mm thick. According to the present invention, 0.7 mm to 1.1 mm low CTE, low alkali glass can be laminated to a less than 6 mm soda lime glass using a polyvinyl butyral laminate by one of a number of laminating processes. The soda lime glass could be annealed, heat strengthened (HS) and/or fully tempered (FT) depending on the strength required to meet relevant transportation or building codes.

In this example, the soda lime glass provides a strength benefit in that it can be annealed, heat strengthened (typically 2× strength of annealed glass) and/or fully tempered (typically 4× strength of annealed glass) to provide additional mechanical strength that may be required by transportation or building codes. Low CTE low alkali glass is typically available only in annealed form, thus the substrate, in this example, the soda lime glass provides the increased strength of the laminated article.

The glass layer, according to the invention, provides one or more of the following advantages: low alkali glass reduces the need for a barrier layer on soda lime glass in order to minimize sodium/alkali diffusion; low alkali glass enhances the performance of organic or inorganic coating, for example, electrochromic, thermochromic, photochromic, low-e; low alkali glass can be processed at high temperatures; low alkali glass can be cut after coating. Thin low alkali glass is light weight and minimizes the cost associated with a low CTE, low alkali product.

Lamination can provide one or more of the following advantages safety, security, sound reduction, UV control, weather/natural disaster benefit, durability, design versatility, installation ease, and low visual distortion. Lamination can be used to laminate a thin, low alkali glass to various substrates. This can be useful in tailoring other properties, for instance, color or self-cleaning properties.

The laminated articles and layered articles of the invention can be used, for example, for electrochromic windows for general transportation (cars, trains, light rail, airplanes, buses), buildings (commercial and residential), and for PV cells both for buildings (commercial and residential), and on-off grid.

The laminated articles and layered articles can be incorporated as the outer, center or inner pane of a single pane, double pane, or triple pane window, for example.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. An architectural window comprising:
   at least a double pane window comprising a first pane and a second pane;
   the first pane comprising a first soda lime glass sheet; and
   the second pane comprising no more than two glass sheets,
     the first glass sheet of the second pane having a thickness of 0.5 to 1.1 mm and comprising:
       a first face and a second face; and
       an alkali oxide content of 10 percent by weight or less;
     the second glass sheet of the second pane comprising a second soda lime glass sheet and having a thickness greater than that of the first glass sheet of the second pane; and
   the second pane further comprising:
     a solid inorganic electrochromic material having a first face and a second face, wherein the first face of the solid inorganic electrochromic material is disposed on the first face of the first glass sheet of the second pane; and
     a protective layer disposed on the second face of the solid inorganic electrochromic material, the protective layer minimizing deleterious effects of exposing the solid inorganic electrochromic material to the environment, wherein the protective layer is not a glass sheet; and a laminate layer disposed on the second face of the first glass sheet of the second pane, between the second glass sheet of the second pane and the first glass sheet of the second pane.

2. The architectural window according to claim 1, wherein the solid inorganic electrochromic material comprises an electrode layer, a counter electrode layer, and an ion conducting layer.

3. The architectural window according to claim 1, wherein the first glass sheet of the second pane has a sodium oxide content of 10 percent by weight or less.

4. The architectural window according to claim 1, wherein the first glass sheet of the second pane has an alkali oxide content of 5 percent by weight or less.

5. The architectural window according to claim 1, wherein the first glass sheet of the second pane has an alkali oxide content is from 0.1 to 10 percent by weight.

6. The architectural window according to claim 1, wherein the laminate layer comprises a material selected from the group consisting of polyvinyl butyral, thermoplastic, a thermoplastic ionoplast, polycarbonate, polyurethane, a UV curable polymer, silicone, and combinations thereof.

7. The architectural window of claim 1, wherein the first glass sheet of the second pane has an alkali oxide content of 0.5 percent by weight or less.

8. The architectural window of claim 1, wherein the first glass sheet of the second pane has a sodium oxide content of 5 percent by weight or less.

9. The architectural window of claim 8, wherein the first glass sheet of the second pane has a sodium oxide content of 0.5 percent by weight or less.

10. The architectural window of claim 1, wherein the protective material comprises a mechanically durable layer having a thickness of 0.5 mm or less.

11. The architectural window of claim 10, wherein the protective material comprises a mechanically durable layer having a thickness of 0.1 mm or less.

12. The architectural window of claim 1, wherein the protective material has a coefficient of thermal expansion (CTE) of $50 \times 10^{-7}/°$ C. or less.

13. The architectural window of claim 12, wherein the protective material has a coefficient of thermal expansion (CTE) of from $20 \times 10^{-7}/°$ C. to $50 \times 10^{-7}/°$ C.

* * * * *